United States Patent
Won et al.

(10) Patent No.: US 7,800,955 B2
(45) Date of Patent: Sep. 21, 2010

(54) PROGRAMMING METHOD OF A NON-VOLATILE MEMORY DEVICE

(75) Inventors: Sam Kyu Won, Icheon-si (KR); Jae Won Cha, Icheon-si (KR); Kwang Ho Baek, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 261 days.

(21) Appl. No.: 12/134,943

(22) Filed: Jun. 6, 2008

(65) Prior Publication Data

US 2009/0097325 A1   Apr. 16, 2009

(30) Foreign Application Priority Data

Oct. 10, 2007   (KR) ..................... 10-2007-0102116

(51) Int. Cl.
*G11C 11/34* (2006.01)
(52) U.S. Cl. ............................ 365/185.22; 365/185.23
(58) Field of Classification Search ............ 365/185.22, 365/185.23, 230.06
See application file for complete search history.

(56) References Cited

U.S. PATENT DOCUMENTS

| 5,818,757 | A  | * | 10/1998 | So et al. ................. | 365/185.18 |
| 6,151,250 | A  | * | 11/2000 | Choi et al. ............. | 365/185.22 |
| 6,356,481 | B1 | * | 3/2002  | Micheloni et al. ...... | 365/185.23 |
| 2008/0253217 | A1 | * | 10/2008 | Taeuber et al. ......... | 365/230.06 |

FOREIGN PATENT DOCUMENTS

| KR | 1020050109835 A | 11/2005 |
| KR | 1020060107716 A | 10/2006 |

* cited by examiner

*Primary Examiner*—Anh Phung
(74) *Attorney, Agent, or Firm*—Townsend and Townsend and Crew LLP

(57) ABSTRACT

In a programming method of a non-volatile memory device, a program operation is performed by applying a program voltage to a selected word line and a first pass voltage to unselected word lines. The first pass voltage shifts to a second pass voltage having a level lower than that of the first pass voltage. A verify operation is performed by applying a verify voltage to the selected word line. The verify voltage has a level lower than that of the second pass voltage.

4 Claims, 6 Drawing Sheets

| LEVOPT | | | | | | | | | VPASS[V] |
|---|---|---|---|---|---|---|---|---|---|
| 31 | 30 | 29 | 28 | ... | 3 | 2 | 1 | 0 | |
| 0 | 0 | 0 | 0 | 0 | 0 | 0 | 0 | 1 | 4.00 |
| 0 | 0 | 0 | 0 | 0 | 0 | 0 | 1 | 0 | 4.25 |
| 0 | 0 | 0 | 0 | 0 | 0 | 1 | 0 | 0 | 4.50 |
| ... | | | | | | | | | |
| 0 | 0 | 1 | 0 | 0 | 0 | 0 | 0 | 0 | 11.25 |
| 0 | 1 | 0 | 0 | 0 | 0 | 0 | 0 | 0 | 11.50 |
| 1 | 0 | 0 | 0 | 0 | 0 | 0 | 0 | 0 | 11.75 |

PROGRAMMING METHOD OF A NON-VOLATILE MEMORY DEVICE

CROSS-REFERENCE TO RELATED APPLICATION

The present application claims priority to Korean patent application number 10-2007-0102116, filed on Oct. 10, 2007, which is incorporated by reference in its entirety.

BACKGROUND OF THE INVENTION

The present invention relates to a programming method of a non-volatile memory device.

In recent years, there has been an increasing demand for non-volatile memory devices which can be electrically programmed and erased and do not need a refresh function of rewriting data at specific intervals.

A non-volatile memory device generally includes a memory cell array in which cells for storing data are arranged in matrix form, and a page buffer for writing memory into specific cells of the memory cell array or reading memory stored in a specific cell. The page buffer includes a bit line pair connected to a specific memory cell, a register for temporarily storing data to be written into the memory cell array, or reading data of a specific cell from the memory cell array and temporarily storing the read data, a sense node for sensing the voltage level of a specific bit line or a specific register, and a bit line select unit for controlling whether the specific bit line is connected to the sense node.

In a typical program operation of the non-volatile memory device, a program operation is performed and a verify operation is then carried out. However, a problem arises because unnecessary steps are performed in a process of applying a program voltage to a selected word line and then applying a verify voltage to the selected word line, and a process of applying a program-prevention voltage (a first pass voltage) to unselected word lines and then applying a verify-prevention voltage (a second pass voltage) to the unselected word lines.

There is another problem in that overshooting is generated in the verify voltage due to the influence of the verify-prevention voltage applied to neighboring word lines when the verify voltage is applied.

BRIEF SUMMARY OF THE INVENTION

The present invention is directed towards a programming method of a non-volatile memory device, which can simplify the step of applying a pass voltage applied to unselected word lines.

According to a programming method of a non-volatile memory device in accordance with an aspect of the present invention, a program operation is performed by applying a program voltage to a selected word line and a first pass voltage to unselected word lines. The first pass voltage shifts to a second pass voltage having a level lower than that of the first pass voltage. A verify operation is performed by applying a verify voltage to the selected word line. The verify voltage has a level lower than that of the second pass voltage.

According to a programming method of a non-volatile memory device in accordance with another aspect of the present invention, a program operation is performed by applying a program voltage to a selected word line and a first pass voltage to unselected word lines. The supply of the program voltage to the selected word line is stopped and the first pass voltage then shifts to a second pass voltage having a level lower than that of the first pass voltage. A verify operation is performed by applying a verify voltage to the selected word line. The verify voltage has a level lower than that of the second pass voltage.

DESCRIPTION OF SPECIFIC EMBODIMENTS

Specific embodiments according to the present invention will be described with reference to the accompanying drawings. However, the present invention is not limited to the disclosed embodiments, but may be implemented in various manners. The embodiments are provided to complete the disclosure of the present invention and to allow those having ordinary skill in the art to understand the present invention. The present invention is defined by the scope of the claims.

Figure 1:
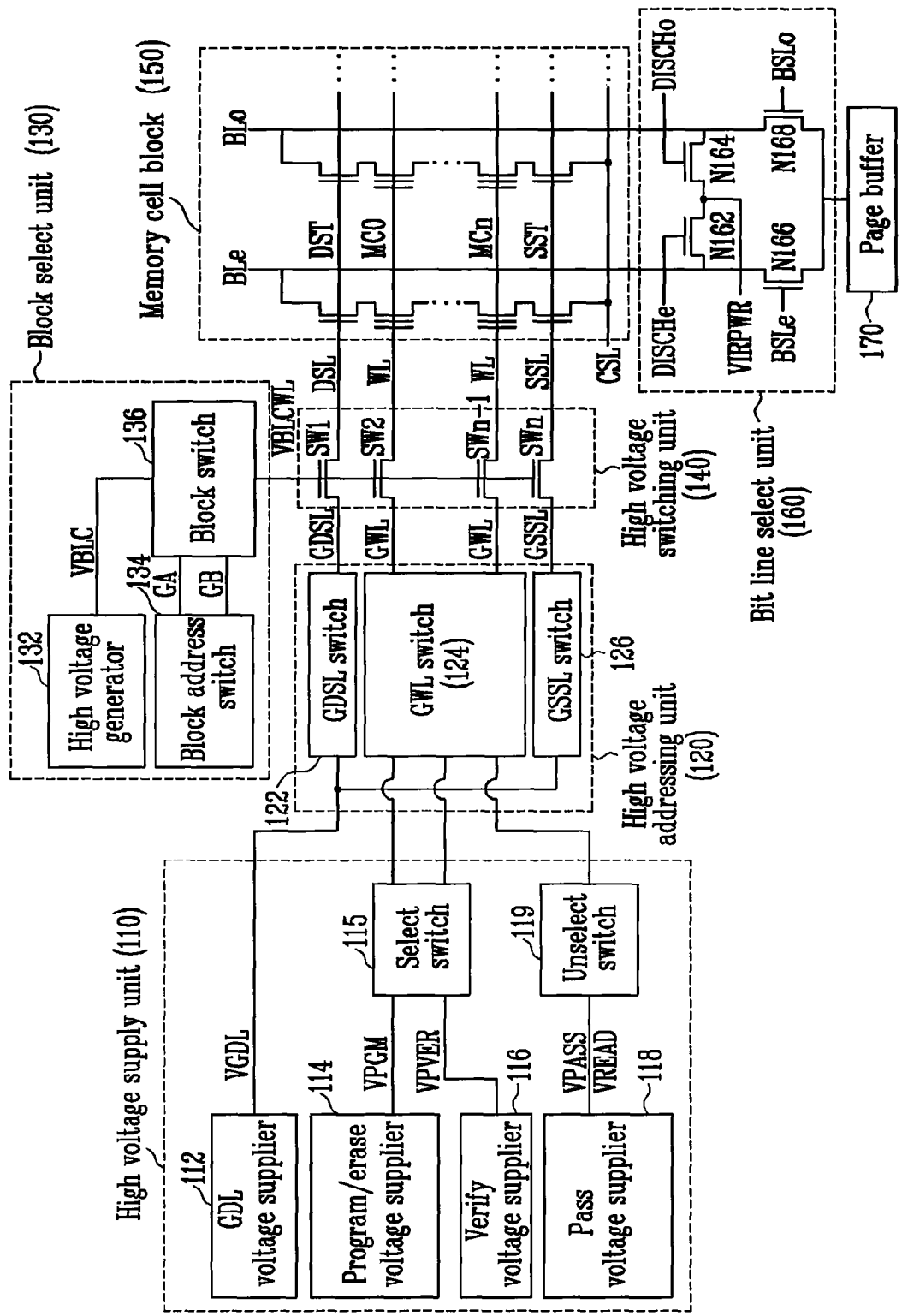
FIG. 1 is a circuit diagram showing a non-volatile memory device to which the present invention is applicable.

FIG. 1 is a circuit diagram showing a non-volatile memory device to which the present invention is applicable.

The non-volatile memory device includes a memory cell block 150 that stores data, a high voltage supply unit 110 that generates and supplies high voltages applied to word lines, a drain select line or a source select line of the memory cell block, a high voltage addressing unit 120 that selectively transfers the high voltages, a high voltage switching unit 140 that cuts off or passes high voltages through the high voltage addressing unit 120 depending on whether a block is selected, and a block select unit 130 that outputs a block select voltage VBLCWL to control operation of the high voltage switching unit 140 depending on whether a specific block is selected.

The non-volatile memory device further includes a page buffer 170 for temporarily storing data to be programmed into a memory cell block or temporarily storing data read from a memory cell block while the non-volatile memory device operates, and a bit line select unit 160 that connects a specific bit line of a bit line pair BLe, BLo of a memory cell block to the page buffer 170.

Each of the constituent elements is described in detail below.

The memory cell block 150 indicates a memory cell of the memory cell array on a per block basis. The unit memory cell block 150 includes a plurality of memory cell strings in each of which a drain select transistor DST, a plurality of memory cells MC0 to MCn, and a source select transistor SST are connected in series.

The bit line select unit 160 includes a NMOS transistor N166 and a NMOS transistor N168. The NMOS transistor N166 connects the even bit line BLe and a sense node (not shown) in response to a first bit line select signal BSLe. The NMOS transistor N168 connects the odd bit line BLo and the sense node in response to a second bit line select signal BSLo.

The bit line select unit 160 further includes a control signal input terminal to which a control signal VIRPWR of a specific level is input, a NMOS transistor N162, and a NMOS transistor N164. The NMOS transistor N162 connects the even bit line BLe and the control signal input terminal in response to a first discharge signal DISCHe. The NMOS transistor N164 connects the odd bit line BLo and the control signal input terminal in response to a second discharge signal DISCHo.

In accordance with this construction, a specific bit line and the page buffer 170 are selectively connected to each other. A detailed operation is described later.

The high voltage supply unit 110 generates and supplies a variety of high voltages, which are necessary during program, read, erase and verify operations of the non-volatile memory device.

The high voltage supply unit 110 includes a program/erase voltage supplier 114, a verify voltage supplier 116, a pass voltage supplier 118, and a GDL voltage supplier 112. The program/erase voltage supplier 114 generates a program voltage VPGM supplied to a selected word line during a program operation and an erase voltage VERASE supplied to the word lines of a corresponding block during an erase operation. The verify voltage supplier 116 generates and supplies a verify voltage VPVER supplied to a selected word line during a verify operation. The pass voltage supplier 118 generates and supplies a read voltage VREAD supplied to a selected word line during a read operation and a pass voltage VPASS supplied to unselected word lines during each of the above operations. The GDL voltage supplier 112 generates and supplies a GDL voltage to turn on the drain select transistor DST and the source select transistor SST during each of the operations. The high voltage supply unit 110 further includes a select switch 115 for switching the program voltages/verify voltages supplied to a selected word line, and an unselect switch 119 for switching the pass voltage VPASS supplied to unselected word lines.

Each of the voltage suppliers includes a charge pump circuit (not shown) for pumping an external power supply voltage to a specific level, and a regulator circuit (not shown) for regulating a pumping voltage to a constant level. The regulator circuits of the voltage suppliers are generally configured to regulate a pumping voltage except that the regulator circuits have different levels of voltages supplied for respective operations.

The high voltage addressing unit 120 selectively supplies the received high voltages to the respective word lines. That is, in the case of program/read/verify voltages, a specific word line is selected and then applied with a voltage. The high voltage addressing unit 120 performs the addressing operation of the word lines.

The high voltage addressing unit 120 includes a global drain select line (GDSL) switch 122, a global source select line (GSSL) switch 126, and a global word line (GWL) switch 124. The GDSL switch 122 receives the GDL voltage from the GDL voltage supplier 112 and supplies the GDL voltage to a global drain select line GDSL connected to the drain select transistor DST. The GSSL switch 126 receives the GDL voltage from the GDL voltage supplier 112 and supplies the GDL voltage to a global source select line GSSL connected to the source select transistor SST. The GWL switch 124 supplies the program/erase/verify/read/pass voltages, etc. to a global word line GWL connected to a specific cell.

The high voltage switching unit 140 passes or cuts off the variety of high voltages received from the high voltage addressing unit 120 depending on whether a memory cell block is selected. In performing program/erase/verify/read operations, etc., when a specific block is selected, the high voltage switching unit 140 passes the respective high voltages and supplies them to each word line. When a specific block is not selected, the high voltage switching unit 140 cuts off the respective high voltages.

The high voltage switching unit 140 includes cut-off transistors SW1 to SWn connected between the global voltage supply lines GDSL, GSSL, and GWL, the memory cells of the memory cell block, and the gates of the drain/source select transistors DST/SST.

Each of the cut-off transistors SW1 to SWn includes a NMOS transistor that is turned on in response to the block select voltage VBLCWL output from the block select unit 130.

The block select unit 130 generates the block select voltage VBLCWL depending on whether the memory cell block 150 is selected and transfers the voltage to the high voltage switching unit 140.

The block select unit 130 includes a high voltage generator 132 that supplies a high voltage VBLC to be used as a block select voltage, a block switch 136 that transfers the high voltage VBLC to the high voltage switching unit 140 depending on whether a specific block is selected, and a block address switch 134 that addresses the block switch 136 depending on whether a specific block is selected.

In the present invention, during a verify operation, the pass voltage VPASS is applied to unselected word lines differently from the prior art. The present invention adopts a construction for changing an operation of the block switch 136. The prior art is described below before the description of the present invention.

Figure 2:
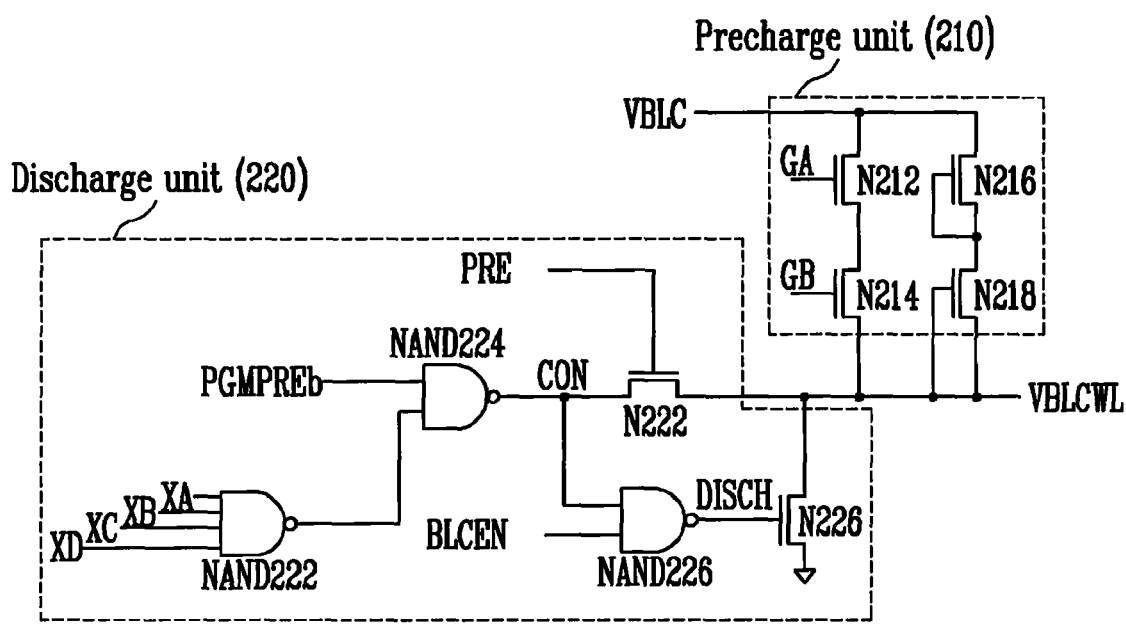
FIG. 2 is a circuit diagram showing a block switch of a non-volatile memory device to which the present invention is applicable.

FIG. 2 is a circuit diagram showing a block switch of a non-volatile memory device to which the present invention is applicable.

A block switch 136 includes a precharge unit 210 and a discharge unit 220. The precharge unit 210 precharges a block word line VBLCWL to a high level in response to the precharge control signals GA/GB. The discharge unit 220 discharges the block word line VBLCWL to a low level in response to block addresses XA, XB, XC, and XD and various control signals PRGPREb, BLCEN, and PRE.

The precharge unit 210 includes NMOS transistors N212, N214 and NMOS transistors N216, N218. The NMOS transistors N212, N214 are turned on according to the precharge control signals GA/GB, respectively, and are connected in series. The NMOS transistors N216, N218 are diode-connected to transfer a high voltage VBLC and are connected in series.

When the precharge control signals GA/GB of a high level are applied, the transistors N212, N214 of the precharge unit 210 are turned on and precharge a block word line to a high level VBLC−Vth.

When the precharge control signals GA/GB of a low level are applied, the transistors N212, N214 are precharged to a high-level voltage VBLC+2Vth, which is increased as high as the threshold voltage, by the diode-connected transistors N216, N218.

The discharge unit 220 includes a first NAND gate NAND222 using the block address signals XA to XD as the inputs, a second NAND gate NAND224 using the first control signal PGMPREb and the output of the first NAND gate NAND222 as the inputs, a first NMOS transistor N222 that transfers the output of the second NAND gate NAND224 to a block word line in response to a second control signal PRE, a third NAND gate NAND226 using a block enable signal BLCEN and the output of the second NAND gate NAND224 as the inputs, and a discharge transistor N226 that grounds the block word line according to the output of the third NAND gate.

If a specific block is selected during operation of the non-volatile memory device, the block address signals are input as a logic high. Thus, the output of the first NAND gate NAND222 becomes a logic low. Accordingly, the second NAND gate NAND224 outputs a high-level voltage irrespective of the first control signal PGMPREb.

Since the output of the second NAND gate NAND224 is a logic high, the discharge transistor N226 is turned on according to the block enable signal BLCEN.

That is, when the block enable signal BLCEN of a high level is input, the third NAND gate outputs a low-level voltage. Thus, the discharge transistor N226 is turned off and, therefore, a discharge operation is not performed.

However, when the block enable signal of a low level is input, the third NAND gate outputs a high-level voltage. Thus, the discharge transistor N226 is turned on and, therefore, a discharge operation in which a ground voltage is applied to the block word line is generated.

A conventional verify operation of a non-volatile memory device is described below.

Figure 3:
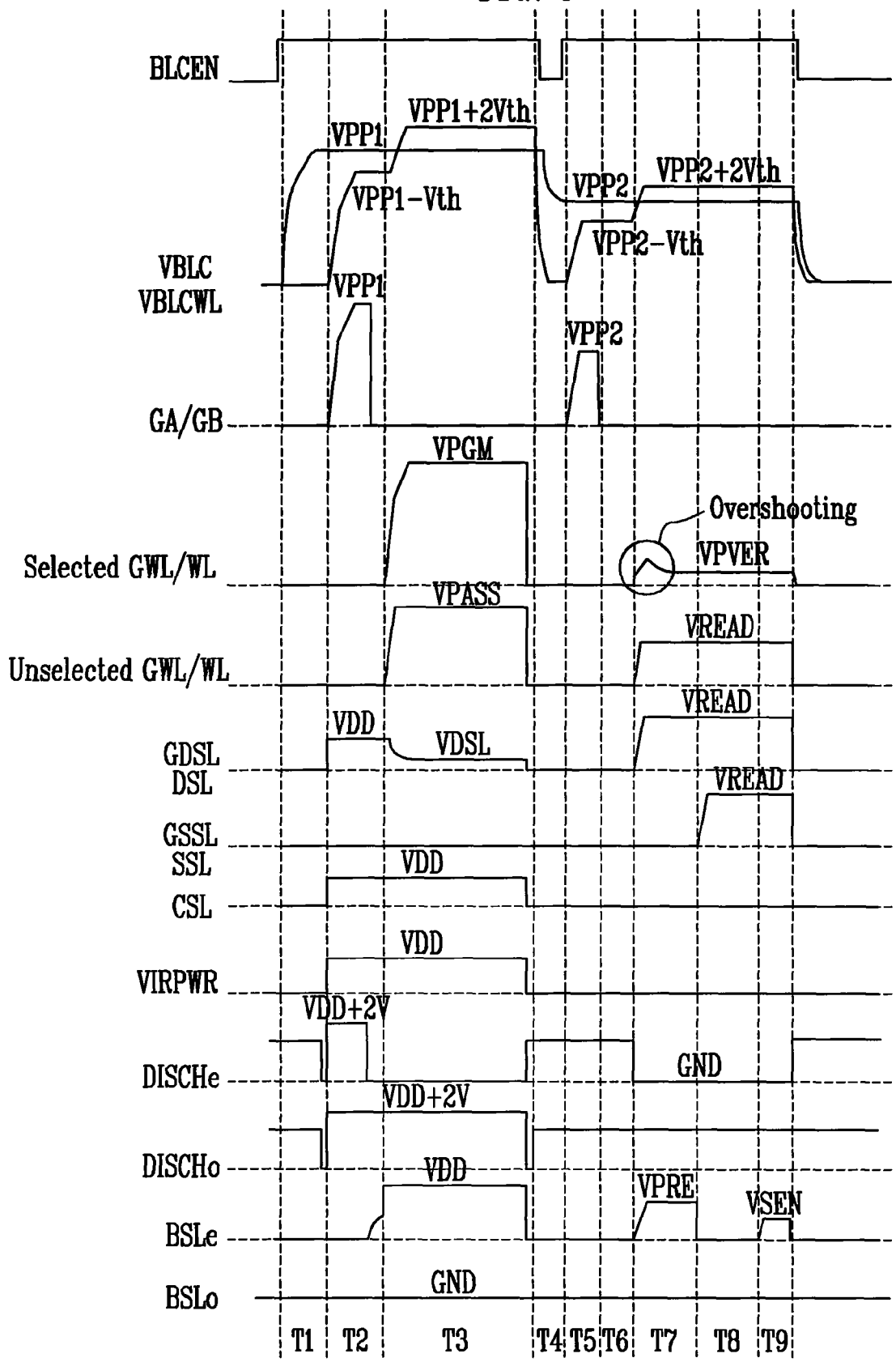
FIG. 3 is a waveform showing various voltages applied during conventional program and verify operations of a non-volatile memory device.

FIG. 3 is a waveform showing various voltages applied during conventional program and verify operations of a non-volatile memory device.

In a first period T1, the high voltage generator 132 of the block select unit 130 generates a first high voltage VPP1. The first high voltage VPP1 has a level where various voltages supplied during a program operation can pass the high voltage switching unit 140. Thus, the high voltage generator 132 generates a voltage higher than a program voltage.

As the block enable signal BLCEN is applied, discharge of the block word line is prevented.

In a second period T2, the precharge control signals GA/GB of a high level are applied to the precharge unit 210 of the block switch 136. Thus, the block word line VBLCWL is precharged to a first precharge voltage VPP1−Vth.

A high-level voltage VDD is applied to the global drain select line GDSL so that the drain select transistor DST is turned on to perform a program operation. The source select transistor SST is not applied with an additional voltage since it is in a floating state.

A high-level voltage is applied to the common line CSL such that the source select transistor SST is cut off.

In a program operation, the page buffer performs an operation of loading data to the bit line and transmitting the data. The bit line is precharged to a high level. For this purpose, the control signal VIRPWR of a high level VDD and first and second discharge signals DISCHe/DISCHo of a high level are applied to the bit line select unit 160. Thus, the NMOS transistors N162, N164 of the bit line select unit 160 are turned on and each bit line is precharged to a high-level voltage.

In a third period T3, the precharge control signals GA/GB applied to the block switch 136 shift to a low level. Thus, the NMOS transistors N212, N214 of the block switch 136 are turned off and the first high voltage VPP1 increases to a second precharge voltage VPP1+2Vth through the diodes N216, N218.

The program voltage VPGM of a high level is applied to a selected global word line, and the pass voltage VPASS having a level lower than that of the program voltage is supplied to unselected global word lines.

In order to apply specific data to a cell connected to the even bit line before the program operation, a first bit line select signal BSLe of a high level is applied. The first discharge signal DISCHe of a high level shifts to a low level. If data is applied to a cell connected to the odd bit line, the second bit line select signal BSLo of a high level is applied to the cell and the second discharge signal DISCHo of a high level shifts to a low level.

For the program operation, a voltage applied to the drain select transistor DST is lowered and then supplied to maximize the channel boosting effect.

In a fourth period T4, the program operation is finished. The program voltage and the pass voltage shift to a low level.

The high voltage generator 132 of the block select unit 130 supplies a second high voltage VPP2 lower than the first high voltage VPP1. The second high voltage VPP2 has a level such that various voltages supplied during a verify operation can pass the high voltage switching unit 140. The levels of the voltages used in the verify operation are lower than of the levels of voltages used in a program operation. Thus, this low voltage is supplied in order to save power consumption.

The voltage supplied to the block word line is discharged temporarily by shifting the block enable signal BLCEN to a low level. That is, the block enable signal BLCEN of a low level is applied to turn on the NMOS transistor N226 of the discharge unit 220 shown in FIG. 2. Accordingly, the block word line is grounded temporarily.

This operation is an operation of finishing the program operation before the verify operation is executed.

Before the verify operation is executed, each bit line is discharged to a low level. The control signal VIRPWR of a low level and the first and second discharge signals DISCHe/DISCHo of a high level are applied to the bit line select unit 160.

In a fifth period T5, the precharge control signals GA/GB of a high level are applied to the precharge unit 210 of the block switch 136. Thus, the block word line VBLCWL is precharged to a third precharge voltage VPP2−Vth.

The block enable signal BLCEN is applied to the discharge unit 220, thereby preventing discharge of the block word line.

In a sixth period T6, the precharge control signals GA/GB of a high level shift to a low level.

In a seventh period T7, as the supply of the precharge control signals GA/GB is stopped, the NMOS transistors N212, N214 of the block switch 136 are turned off and the second high voltage VPP2 increases to a fourth precharge voltage VPP2+2Vth through the diodes N216, N218.

The verify voltage VPVER of a high level is applied to a selected global word line and the read voltage VREAD, having a level higher than that of the verify voltage, is applied to unselected global word lines. This is for determining whether a cell connected to the selected word line has been programmed above a verify voltage. The voltage VREAD of a high level is applied to the global drain select line. Thus, the drain select transistor DST is turned on. This is for forming a current path from the bit line to the cell string.

In order to perform the verify operation on a cell connected to the even bit line, the first discharge signal DISCHe shifts to a low level and the even bit line is precharged to a high level.

The first bit line select signal BSLe of a first level VPRE is applied in order to limit the voltage level, which is precharged to the bit line, to a first level or less.

An eighth period T8 includes an evaluation period where the voltage level of the bit line precharged to the high level is changed depending on whether a specific cell is programmed.

The voltage VREAD of a high level is applied to the global source select line in order to turn on the source select transistor DST. The first bit line select signal BSLe shifts to a low level.

Although the voltage level of the bit line is not shown, the voltage level of the bit line maintains a high level when a specific cell is programmed. When a specific cell is not programmed, a current path to the common source line is formed. Thus, the voltage level of the bit line shifts to a low level.

In a ninth period T9, the first bit line select signal BSLe of the second level VSEN is applied to sense data supplied to a specific cell. Voltage levels applied to the sense node of the page buffer are varied depending on whether the specific cell has been programmed. Specific data is stored in a register (not shown) of the page buffer by employing the same process.

The time periods that are problematic in the program and verify operations are the fourth and fifth periods.

That is, before the verify operation is performed after the program operation is performed, the pass voltage VPASS of the first level supplied to the unselected word line is discharged and the pass voltage VREAD of the second level is then applied.

As described above, additional time is consumed for recharging after discharging. Furthermore, as the pass voltage VREAD of the second level and the verify voltage VPVER supplied to a selected line are applied at the same time, an overshooting phenomenon is generated in the verify voltage due to a coupling phenomenon between neighboring word lines. This causes a voltage higher than a verify voltage to be applied during a verify operation. Thus, an error in the verify operation may occur.

Problems arise because the operation for discharging the second precharge voltage VPP1+2Vth, applied to the block word line, to a low level is performed to discharge the pass voltage of the first level and an additional operation for applying the precharge control signals GA/GB must be carried out.

The present invention addresses the above problems. According to the present invention, the process of discharging the pass voltage of the first level is not performed.

Figure 4:
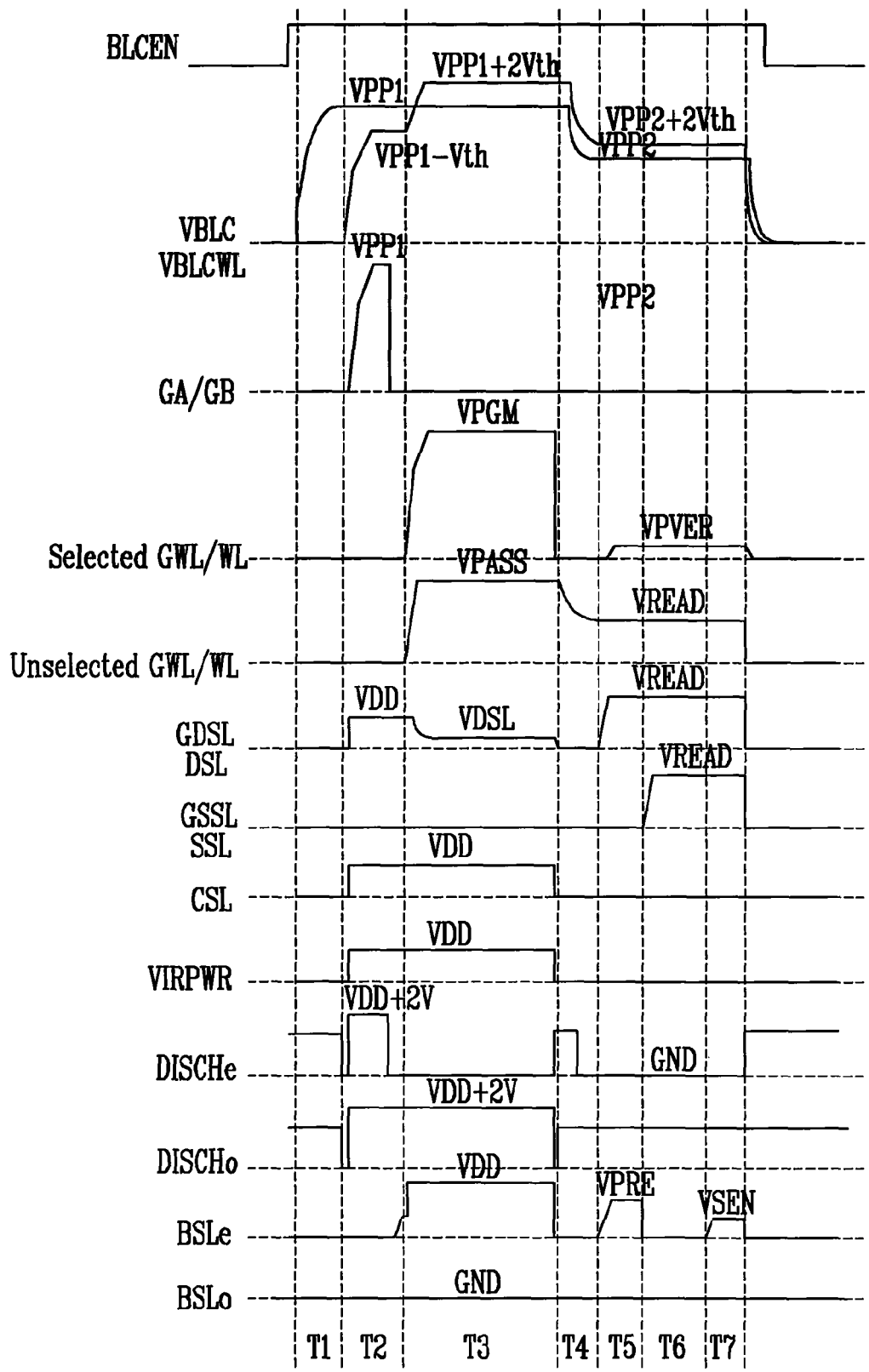
FIG. 4 is a waveform showing various voltages applied during program and verify operations of a non-volatile memory device according to an embodiment of the present invention.

FIG. 4 is a waveform showing various voltages applied during program and verify operations of a non-volatile memory device according to an embodiment of the present invention.

In a first period T1, the high voltage generator 132 of the block select unit 130 generates a first high voltage VPP1. The first high voltage VPP1 has a level at which various voltages supplied during a program operation can pass the high voltage switching unit 140. Thus, the high voltage generator 132 generates a voltage higher than a program voltage.

As the block enable signal BLCEN is applied, discharge of the block word line is prevented.

In a second period T2, the precharge control signals GA/GB of a high level are applied to the precharge unit 210 of the block switch 136. Thus, the block word line VBLCWL is precharged to a first precharge voltage VPP1−Vth.

A high-level voltage VDD is applied to the global drain select line GDSL so that the drain select transistor DST is turned on for a program operation. The source select transistor SST is not applied with an additional voltage since it is in a floating state.

A high-level voltage is applied to the common line CSL such that the source select transistor SST is cut off.

In a program operation, the page buffer performs an operation of loading data to the bit line and transmitting the data. The bit line is precharged to a high level. For this purpose, the control signal VIRPWR of a high level VDD and first and second discharge signals DISCHe/DISCHo of a high level are applied to the bit line select unit 160. Thus, the NMOS transistors N162, N164 of the bit line select unit 160 are turned on and each bit line is precharged to a high-level voltage.

In a third period T3, the precharge control signals GA/GB applied to the block switch 136 shift to a low level. Thus, the NMOS transistors N212, N214 of the block switch 136 are turned off, and the first high voltage VPP1 increases to a second precharge voltage VPP1+2Vth through the diodes N216, N218.

The program voltage VPGM of a high level is applied to a selected global word line, and the pass voltage VPASS having a level lower than that of the program voltage is supplied to unselected global word lines.

In order to apply specific data to a cell connected to the even bit line before the program operation, a first bit line select signal BSLe of a high level is applied. The first discharge signal DISCHe of a high level shifts to a low level. If data is applied to a cell connected to the odd bit line, the second bit line select signal BSLo of a high level is applied to the cell and the second discharge signal DISCHo of a high level shifts to a low level.

For the program operation, a voltage applied to the drain select transistor DST is lowered and then supplied to maximize the channel boosting effect.

In a fourth period T4, the program operation is finished, and the program voltage is discharged to a low level.

Further, before the execution of the verify operation, each bit line is discharged to a low level. The control signal VIRPWR of a low level and the first and second discharge signals DISCHe/DISCHo of a high level are applied to the bit line select unit 160.

The first pass voltage VPASS applied to unselected word lines is not discharged to a low level, but shifts to the second pass voltage VREAD having a level lower than that of the first pass voltage VPASS.

As described above, the second pass voltage VREAD is not supplied again after the first pass voltage VPASS is grounded. Rather, the level of the first pass voltage VPASS is changed and the second pass voltage VREAD is then supplied.

The high-level state is maintained without discharging the voltage applied to the block word line. Accordingly, the high voltage switching unit 140 remains active, and the second pass voltage VREAD transferred from the pass voltage supplier 118 may be supplied to the word line without change.

The operation of shifting the first pass voltage VPASS to the second pass voltage VREAD as described above is accomplished by the pass voltage supplier 118. This is described with reference to the accompanying drawing.

Figure 5:
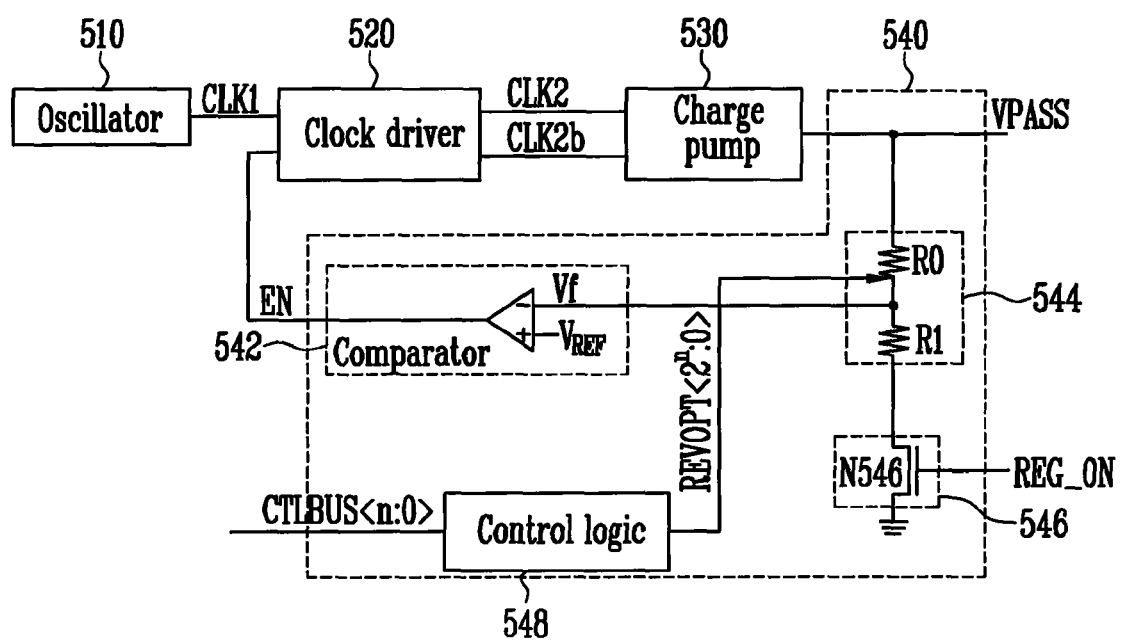
FIG. 5 is a circuit diagram showing a pass voltage supplier according to an embodiment of the present invention.

FIG. 5 is a circuit diagram showing the pass voltage supplier according to an embodiment of the present invention.

The pass voltage supplier 118 includes an oscillator 510, a clock driver 520, a charge pump 530, and a regulator 540.

The oscillator 510 generates a clock signal CLK1 of a specific cycle and transfers it to the clock driver 520.

The clock driver 520 delays the clock signal CLK1 according to an output signal EN of a comparator 542 included in the regulator 540, and outputs two clock signals CLK2 and CLK2b with different levels.

The charge pump 530 performs a pumping operation according to the two clock signals CLK2 and CLK2b with different levels, which are output from the clock driver 520, and outputs a specific pumping voltage VPP.

The regulator 540 regulates the pumping voltage to a voltage of a specific level and supplies the pumping voltage as the pass voltage VPASS.

The regulator 540 includes a voltage divider 544, the comparator 542, a driver 546 and a control logic 548. The voltage divider 544 divides the pumping voltage received from the charge pump 530 and outputs a divided voltage Vf. The comparator 542 compares the divided voltage Vf and a reference voltage VREF and controls an operation of the clock driver 520 according to the comparison result. The driver 546 supplies a GND voltage to the voltage divider 544 according to driving control signal REG_ON. The control logic 548 controls the amount of the divided voltage Vf.

The voltage divider 544 includes a plurality of resistors that are connected in series. The voltage divider 544 outputs the divided voltage Vf input to the comparator 542 according to the ratio of the resistances. The voltage divider 544 includes first and second resistors R0, R1, which are connected in series between the pumping voltage output terminal and a ground, and outputs the divided voltage Vf according to the ratio of the resistances. The control logic 548 controls the level of the pass voltage VPASS by controlling the resistance value of the first resistor R0. A detailed construction of the first resistor R0 is described later.

The comparator 542 compares the reference voltage VREF and the divided voltage Vf, and outputs a high-level signal to the clock driver 520 when the reference voltage is higher than the divided voltage Vf.

The driver 546 includes a NMOS transistor N546. The NMOS transistor N546 supplies a GND voltage to the voltage divider 544 in response to driving control signal REG_ON. By applying the driving control signal REG_ON, the regulator 540 is driven.

The value of the final pumping voltage VPP according to this construction is calculated by the following equation. This voltage becomes the pass voltage.

$$VPASS = \left(1 + \frac{R0}{R1}\right) \times VREF1$$

The control logic. 548 controls the resistance value of the first resistor R0 connected between the output terminal of the voltage divider 544 and the ground.

The control logic 548 decodes a level control signal CTLBUS<n:0> (that is, digital data), which is received through a data bus, and produces $2^n$ decoding signals LEVOPT<$2^n$:0>. The control logic 548 then outputs one value corresponding to the decoding signals as an output so that a specific resistance value of predetermined $2^n$ first resistance values is selected.

This is described in more detail below with reference to the accompanying drawings.

Figures 6A, 6B:
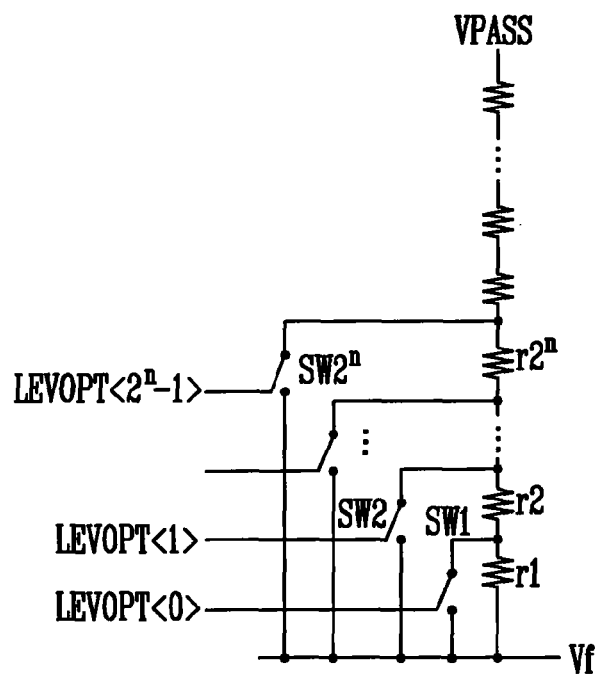
FIG. 6A is a circuit diagram showing a detailed construction of a first resistor of a voltage divider.
FIG. 6B is a table showing a change of the levels of pass voltages depending on a change of first resistance values of the voltage divider.

FIG. 6A is a circuit diagram showing a detailed construction of a first resistor of a voltage divider. FIG. 6B is a table showing a change of the levels of pass voltages depending on a change of first resistance values of the voltage divider.

The first resistor R0 includes $2^n$ resistors r1 to r$2^n$ which are connected in series between the output terminal VPASS of the regulator and the second resistor R1 of the voltage divider 544.

Switches SW1 to SW$2^n$ are connected between connection nodes between the respective resistors and a node connected to the second resistor R1 of the voltage divider 544. The switches are turned on in response to a decoding signal. Thus, when a specific decoding signal (for example, a second decoding signal LEVOPT<1>) is applied, a corresponding switch SW2 is turned on, the resistors r1, r2 connected between a node connected to the corresponding switch and the second resistor R1 of the voltage divider 544 are shorted, and a first resistance value is determined by the sum of the remaining resistors that are connected in series.

FIG. 6B is a table showing a change of resistance values depending on the input of the decoding signal.

Since the first resistance values differ depending on the number of the decoding signals, the level of the pass voltage is changed.

According to this construction, the pass voltage can shift from the first pass voltage to the second pass voltage.

As described above, the shifting operation from the first pass voltage to the second pass voltage can save power when compared with the conventional operation. That is, power consumption can be saved when compared with the conventional operation for discharging the first pass voltage and then applying the second pass voltage again.

Further, the time necessary for the verify operation can be shortened since operations, which are performed before the verify operation, can be omitted.

Unlike unselected word lines, a selected word line is applied with the program voltage, and then undergoes a discharge process before the verify voltage is applied. This is performed through the select switch 115 of FIG. 1. That is, the select switch 115 is controlled to stop the supply of the program voltage and then supply the verify voltage after a lapse of a certain time period (for example, in the period T5).

The remaining operations are described with reference to FIG. 4.

In a fifth period T5, the verify voltage VPVER of a high level is supplied to a selected global word line and the second pass voltage VREAD, having a level higher than that of the verify voltage, is applied to unselected global word lines. This is for determining whether a cell connected to the selected word line has been programmed over the verify voltage.

The second pass voltage VREAD is not applied simultaneously with the verify voltage VPVER, but is shifted from the first pass voltage VPASS before the verify voltage is applied. Accordingly, an overshooting phenomenon, which may occur when the verify voltage and the second pass voltage are applied at the same time as shown in FIG. 3, can be prevented.

The voltage of the high level VREAD is applied to the global drain select line so that the drain select transistor DST is turned on. This is for forming a current path from the bit line to the cell string.

To perform the verify operation on a cell connected to the even bit line, the first discharge signal DISCHe shifts to a low level and the even bit line is precharged to a high level.

The first bit line select signal BSLe of the first level VPRE is applied to limit the voltage level, which is precharged by the bit line, to the first level or less.

A sixth period T6 includes an evaluation period where the voltage level of the bit line precharged to the high level is changed depending on whether a specific cell is programmed.

The voltage of the high level VREAD is applied to the global source select line so that the source select transistor DST is turned on. The first bit line select signal BSLe shifts to a low level.

Although the voltage level of the bit line is not shown, the voltage level of the bit line maintains a high level when a specific cell is programmed. When a specific cell is not programmed, a current path leading to the common source line is formed. Thus, the voltage level of the bit line shifts to a low level.

In a ninth period T7, the first bit line select signal BSLe of the second level VSEN is applied to sense data supplied to a specific cell. Voltage levels applied to the sense node of the page buffer are varied depending on whether the specific cell has been programmed. Specific data is stored in a register (not shown) of the page buffer by employing the same process.

According to this construction, the time necessary to complete the verify operation can be shortened. Further, an overshooting phenomenon of the verify voltage, which occurs when applying the second pass voltage, can be prevented.

As described above, according to the present invention, before the application of the verify voltage after a program is finished, the second pass voltage is applied. Accordingly, an overshooting phenomenon occurring when the verify voltage is applied can be prevented.

After the first pass voltage is applied, the first pass voltage shifts to the second pass voltage without discharging. Accordingly, the time necessary for the verify operation can be shortened.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A programming method of a non-volatile memory device, the method comprising:
    performing programming by applying a program voltage to a selected word line and a first pass voltage to unselected word lines;
    shifting the first pass voltage to a second pass voltage, wherein the second pass voltage has a level that is lower than a level of the first pass voltage; and
    performing verification by applying a verify voltage to the selected word line, wherein the verify voltage has a level that is lower than the level of the second pass voltage.

2. The programming method of claim 1, further comprising, after the programming is performed, stopping the supply of the program voltage applied to the selected word line.

3. The programming method of claim 1, wherein the shift of the first pass voltage to the second pass voltage includes maintaining a block word line voltage at a high level in order to maintain an activation state of a high voltage switching unit.

4. A programming method of a non-volatile memory device, the method comprising:
    performing programming by supplying a program voltage to a selected word line and a first pass voltage to unselected word lines;
    stopping the supply of the program voltage to the selected word line;
    shifting the first pass voltage to a second pass voltage, wherein the second pass voltage has a level that is lower than a level of the first pass voltage; and
    performing verification by applying a verify voltage to the selected word line, wherein the verify voltage has a level that is lower than the level of the second pass voltage.

* * * * *